(12) United States Patent
Catthoor et al.

(10) Patent No.: US 9,244,701 B2
(45) Date of Patent: Jan. 26, 2016

(54) METHOD FOR SYSTEM SCENARIO BASED DESIGN OF DYNAMIC EMBEDDED SYSTEMS

(71) Applicants: IMEC, Leuven (BE); Stichting IMEC Nederland, Eindhoven (NL); Katholieke Universiteit Leuven, K.U. LEUVEN R&D, Leuven (BE)

(72) Inventors: Francky Catthoor, Temse (BE); Evangelos Bempelis, La Tronche (FR); Wim Van Thillo, Mortsel (BE); Praveen Raghavan, Heverlee (BE); Robert Fasthuber, St. Marienkirchen (AT); Elena Hammari, Trondheim (NO); Per Gunnar Kjeldsberg, Trondheim (NO); Jos Huisken, GV Waalre (NL)

(73) Assignees: IMEC, Leuven (BE); Stichting IMEC Nederland, Eindhoven (NL); Katholieke Universiteit Leuven, KU Leuven R&D, Leuven (BE)

( * ) Notice: Subject to any disclaimer, the term of this patent is extended or adjusted under 35 U.S.C. 154(b) by 90 days.

(21) Appl. No.: 13/940,247

(22) Filed: Jul. 11, 2013

(65) Prior Publication Data
US 2014/0019739 A1    Jan. 16, 2014

(30) Foreign Application Priority Data

Jul. 13, 2012    (EP) .................... 12176304

(51) Int. Cl.
*G06F 3/0484*    (2013.01)
*G06F 9/445*    (2006.01)
*G06F 17/50*    (2006.01)

(52) U.S. Cl.
CPC ........ *G06F 9/44505* (2013.01); *G06F 17/5045* (2013.01)

(58) Field of Classification Search
CPC ............... G06F 7/78; G06F 8/00–8/78; G06F 9/44–9/455; G06F 11/36
See application file for complete search history.

(56) References Cited

U.S. PATENT DOCUMENTS 6,396,492 B1 * 5/2002 Frisken ................... G06T 17/00
345/420

OTHER PUBLICATIONS

Gheorghita et al., System Scenario based Design of Dynamic Embedded Systems, 2007.*

(Continued)

*Primary Examiner* — Wei Zhen
*Assistant Examiner* — Zhan Chen
(74) *Attorney, Agent, or Firm* — McDonnell Boehnen Hulbert & Berghoff LLP

(57) ABSTRACT

Methods are disclosed for system scenario-based design for an embedded platform whereon a dynamic application is implemented. The application meets at least one guaranteed constraint. Temporal correlations are assumed in the behavior of internal data variables used in the application, with the internal data variables representing parameters used for executing a portion of the application. An example method includes determining a distribution over time of an N-dimensional cost function, with N an integer number N≥1, corresponding to the implementation on the platform for a set of combinations of the internal data variables. The method also includes partitioning an N-dimensional cost space in at least two bounded regions, each bounded region containing cost combinations corresponding to combinations of values of the internal data variables of the set that have similar cost and frequency of occurrence, whereby one bounded region is provided for rarely occurring cost combinations.

17 Claims, 5 Drawing Sheets

(56) References Cited

OTHER PUBLICATIONS

Caldwell et al., "Relaxed Partitioning Balance Constraints in Top-Down Placement", 1998.*
Gheorghita et al., "System Scenario based Design of Dynamic Embedded Systems", 2007.*
European Search Report, European Patent Application No. 12176304.9, dated Nov. 19, 2012.
Van Stralen, Peter et al., "Fast Scenario-Based Design Space Exploration Using Feature Selection", ARCS Workshops (ARCS), IEEE, Feb. 28, 2012, pp. 1-7.
Zimmermann, Jochen et al., "Analysis of Multi-Domain Scenarios for Optimized Dynamic Power Management Strategies", Design, Automation & Test in Europe Conference & Exhibition, IEEE, Mar. 12, 2012, pp. 862-865.
Van Stralen, Peter et al., "Scenario-Based Design Space Exploration of MPSoCs", Computer Design (ICCD), IEEE International Conference, Oct. 3, 2010, pp. 305-312.
Gheorghita, S.V. et al., "System Scenario Design of Dynamic Embedded Systems", ACM Trans. on Design Automation of Electronic Systems, vol. 14, No. 1, Jan. 2008, pp. 1-44.
Van Stralen, Peter et al., "A Trace-Based Scenario Database for High-Level Simuliation of Multimedia MP-SoCs", Embedded Computer Systems (SAMOS), 2010 International Conference, Jul. 19-22, 2010, pp. 11-19.
Frantzen, L. et al., "A Symbolic Framework for Model-Based Testing", FATES/RV 2006, LNCS, vol. 4262, Aug. 15-16, 2011, pp. 40-54.
Bebelis, Vagelis, "System Scenarios Using Data Correlation in FFT Input", WIC Symposium May 10, 2011, 1 page.
32nd WIC Symposium on Information Theory in the Benelux—First Joint WIC/IEEE SP Symposium on Information Theory and Signal Processing in the Benelux, May 10-11, 2011, Brussels, Belgium, 7 pages.

* cited by examiner

METHOD FOR SYSTEM SCENARIO BASED DESIGN OF DYNAMIC EMBEDDED SYSTEMS

CROSS-REFERENCE TO RELATED APPLICATION

This application claims priority to European Patent Application No. 12176304.9 filed on Jul. 13, 2012, the contents of which are hereby incorporated by reference.

TECHNICAL FIELD

The present disclosure is related to the field of generic and systematic design-time/run-time methods capable of handling the dynamic nature of embedded systems.

BACKGROUND

Real-time embedded systems have become much more complex due to the introduction of a lot of new functionality in one application, and due to running multiple applications concurrently. This increases the dynamic nature of today's applications and systems and tightens the requirements for their constraints in terms of deadlines and energy consumption. State-of-the-art design methodologies try to cope with these issues by identifying several most used cases and dealing with them separately, reducing the newly introduced complexity.

Embedded systems usually comprise processors that execute domain-specific applications. These systems are software intensive, having much of their functionality implemented in software, which is running on one or multiple processors, leaving only the high performance functions implemented in hardware. Typical examples include TV sets, cellular phones, wireless access points, MP3 players and printers. Most of these systems are running multimedia and/or telecom applications and support multiple standards. Thus, these applications are full of dynamism, i.e., their execution costs (e.g., number of processor cycles, memory usage, energy) are environment dependent (e.g., input data, processor temperature).

Scenario-based design in general has been used for some time in both hardware and software design of embedded systems. In both of these cases, scenarios concretely describe, in an early phase of the development process, the use of a future system. These scenarios are called use-case scenarios. They focus on the application functional and timing behaviours and on the interaction with the users and environment, and not on the resources required by a system to meet its constraints. These scenarios are used as an input for design approaches centred round the application context.

The present disclosure, however, focuses on a different and complementary type of scenarios, called system scenarios. System scenario-based design methodologies have recently been successfully applied to reduce the costs of dynamic embedded systems. They provide a systematic way of constructing workload-adaptive embedded systems and have already been proposed for multimedia and wireless domains. At design-time, the system is separately optimized for a set of system scenarios with different costs, e.g., alternative mapping and scheduling of tasks on multiprocessor systems. At run-time, certain parameters are monitored, changes to the current scenario situation are detected, and mapping and scheduling are changed accordingly. Up to today, only so-called control variable-based system scenario approaches based on bottom-up clustering have been studied in-depth in the literature.

State-of-the-art advanced multiprocessor system-on-chip platforms and applications typically require a dynamic scheduling of instructions and threads to be able to meet stringent performance and low energy requirements. The Task Concurrency Management (TCM) methodology is a systematic approach for mapping an application onto a multiprocessor platform in real-time embedded systems. The methodology is based on a two-step scheduling technique that, at design-time, performs computation-intensive parts of the mapping and scheduling, leaving for run-time the parts that result in less overhead for computing the actual schedule.

An application is divided into thread frames, each consisting of a number of thread nodes, as will be further detailed below. At design-time, each thread node is profiled to find its execution time and power consumption for all possible input data and on all possible processors on the platform. With profiling is meant the simulation of hardware based emulation of the system behaviour to obtain the system responses for a representative set of input stimuli. The resulting numbers are used to find all thread frame schedules with an optimal trade-off between execution time and energy consumption. A schedule candidate is optimal if it, e.g., has the lowest energy consumption for a given execution time. As a result, each thread frame has a set of optimal schedules along a curve in a two-dimensional execution time-energy consumption solution space. In cases where different sets of input data give too wide a spread in a thread node's execution times, system scenarios can be used to find a thread frame Pareto-curve for each of the individual scenarios. Each system scenario corresponds then to a different (non-overlapping) cluster of run-time situations that are similar enough in their Pareto-curve positions (close enough in the N-dimensional trade-off space, see also further). At run-time, input data is monitored to keep track of the currently active scenario. It should be stressed though that system-scenario based approaches for identifying clusters of similar run-time situations are usable in many more contexts than only thread-frame scheduling of dynamic embedded systems. This disclosure focuses on the broadly applicable system scenario concept itself.

The scenarios are derived from the combination of the application behaviour and the application mapping on the system platform. These scenarios are used to reduce the system cost by exploiting information about what can happen at run-time to make better design decisions at design-time, and to exploit the time-varying behaviour at run-time. While use-case scenarios classify the application's behaviour based on the different ways the system can be used in its over-all context, system scenarios classify the behaviour based on the multi-dimensional cost trade-off during the implementation trajectory. By optimizing the system per scenario and by ensuring that the actual system scenario is predictable at run-time, a system setting can be derived per scenario to optimally exploit the system scenario knowledge.

FIG. 1 depicts a design trajectory using use-case and system scenarios. It starts from a product idea, for which the product's functionality is manually defined as use-case scenarios 1, 2, and 3. These scenarios characterize the system from a user perspective and are used as an input to the design of an embedded system that includes both software and hardware components. In order to optimize the design of the system, the detection and usage of system scenarios augments this trajectory (the cost perspective box of FIG. 1). The run-time behaviour of the system is classified into several system scenarios (A and B in FIG. 1), with similar cost trade-offs within a scenario. For each individual scenario, more specific and aggressive design decisions can be made. The sets of use-case scenarios and system scenarios are not necessarily disjoint, and it is possible that one or more use-case scenarios correspond to one system scenario. But still, they are usually not overlapping, and it is likely that a use-case scenario is split into several system scenarios, or even that several system scenarios intersect several use-case scenarios.

The system scenario-based design methodology is a powerful tool that can also be used for fine grain optimizations at the task abstraction level and for simultaneous optimization of multiple system costs. The ability of handling multiple and non-linear system costs differentiates system-based design methodologies from the dynamic run-time managers intended for Dynamic Voltage and Frequency Scaling (DVFS) type platforms. DVFS methodologies concentrate on optimization of a single cost (the energy consumption of the system), that scales monotonically with frequency and voltage. They perform direct selection of the system reconfiguration from the current workload situation. This, however, cannot be generalized for costs that depend on the parameters in a non-uniform way. That makes the decision in one runtime step too complex. Scenario-based design methodologies solve this problem by a two-stage approach decided at runtime: they first identify what scenario the working situation belongs to, and then choose the best system reconfiguration for that scenario. Since the relationship between the parameters and the costs will, in practice, be very complex, the scenario identification is, however, performed at design-time.

When using system scenarios, both information about the system at design time and the occurrence of certain types of input at run-time, which results in particular (groupings of) run-time situations, are considered. The term "run-time situation" (RTS) is an important concept used in task level system scenario-based design methodologies. An RTS is a piece of system execution with an associated cost that is treated as a unit. The cost usually consists of one or several primary costs, like quality and resource usage (e.g., number of processor cycles, memory size). The system execution on a given system platform is a sequence of RTSs. One complete run of the application on the target platform represents the sequence of RTSs. The current RTS is known only at the moment it occurs. However, at run-time, using various system parameters—so-called RTS parameters—it can be predicted in advance in which RTS the system will run next for a non-zero future time window. If the information about all possible RTSs in which a system may run is known at design-time, and the RTSs are considered in different steps of the embedded system design, a better optimized (e.g., faster or more energy efficient) system can be built because specific and aggressive design decisions can be made for each RTS. These intermediate per-RTS optimizations lead to a smaller, cheaper and more energy efficient system that can deliver the required quality. In general, any combination of N cost dimensions may be targeted. However, the number of cost dimensions and all possible values of the considered RTS parameters may lead to an exponential number of RTSs. This will degenerate to a long and really complicated design process, which does not deliver the optimal system. Moreover, the run-time overhead of detecting all these different RTSs will be too high compared to the expected gain over their (quite) short time windows. To avoid this situation, the RTSs are classified and clustered from an N-dimensional cost perspective into system scenarios, such that the cost trade-off combinations within a scenario are always fairly similar (i.e their Euclidean distance in the N-dimensional cost space is relatively small), the RTS parameter values allow an accurate prediction, and a system setting can be defined that allows to exploit the scenario knowledge and optimizations.

In the paper '*System scenario based design of dynamic embedded systems*' (V. Gheorghita et al., *ACM Trans. On Design Automation for Embedded Systems*, Vol. 14, No. 1, January 2009), a general methodology is proposed which can be instantiated in all contexts wherein a system scenario concept is applicable. Important steps of the method comprise choosing a good scenario set, deciding which scenario to switch to (or not to switch), using the scenario to change the system knobs, and updating the scenario set based on new information gathered at run-time. This leads to a five step methodology, including design time and run-time phases. The first step, identification, is somewhat special in this respect, in the sense that its run-time phase is merged into the run-time phase of the final step, calibration. The initial identification at run-time is incorporated in the detection step, but a re-identification can happen at run-time in a calibration step.

The various steps are now introduced. Special attention is hereby paid to the steps that are most relevant for the present disclosure.

Design-Time Identification of the Scenario Set

In order to gain the advantages offered by a scenario approach, it is necessary to identify the different scenarios that group all possible RTSs. A scenario identification technique therefore lies at the heart of any system scenario-based design methodology. It determines how the different observed RTSs should be divided into groups with similar costs, i.e. The system scenarios, and how these system scenarios should be represented to make their run-time prediction as simple as possible. In prior art system scenario based solutions, parameters that decide the scenario boundaries have been limited to control variables, or variables with a limited number of distinct values.

In the identification step the relevant RTS parameters are selected and the RTSs are clustered into scenarios. This clustering is based on the cost trade-offs of the RTSs, or an estimate thereof. The identification step should take as much as possible into account the overhead costs introduced in the system by the following steps of the methodology. As this is not easy to achieve, an alternative solution is to refine the scenario identification (i.e., to further cluster RTSs) during these steps.

A task-level scenario identification split can be performed in two steps. In the first step, the variables in the application code are analyzed, either statically, or through profiling of the application with a representative data set. The variables having most impact on the run-time cost of the system are determined. These variables are called RTS parameters, denoted by $\xi_1, \xi_2, \ldots, \xi_k$, and are used to characterize system scenarios and design the scenario prediction mechanism. Typically a small set of RTS parameters is selected to keep the run-time prediction overhead low.

The output of the first step is the set of the selected RTS parameters and, for each RTS i, its RTS signature is given by Equation 1 below:

$$r(i) = \xi_1(i), \xi_2(i), \ldots, \xi_k(i); c(i), \tag{1}$$

containing parameter values $\xi_1(i), \xi_2(i), \ldots, \xi_k(i)$ and the corresponding task costs c(i), i.e., each run instance of each task has its own RTS signature. The number N of RTS signatures will hence be very large. Depending on the number of RTS parameters and how many different values each of them can take, there is a small or large number of different RTS signatures. This is important for the complexity of the second step of the scenario identification. In this second step, the RTS signatures are divided into groups with similar costs—the system scenarios. This can be done by a bottom-up clustering of RTS signatures with a resulting multi-valued decision diagram (MDD) that is used as a predictor for the upcoming system scenario (see step of scenario prediction).

As mentioned, the impact of RTS parameters can be evaluated either statically or through profiling. When based on purely static analysis of the code, the frequencies of occurrence of different RTS parameter values are not taken into consideration. Therefore, system scenarios may be produced that almost never occur. This technique can be extended with profiling information, and then forms a system scenario set that exploits run-time statistics. This approach typically leads to only a limited amount of parameters being labelled as important enough to incorporate in the identification step, which is crucial to limit the complexity.

The existing scenario identification approaches cannot be used in a system with many-valued RTS parameters, causing an explosion of states in the MDD and the associated run-time/implementation costs. In that case the bottom-up clustering approach has a fundamental complexity limitation which cannot be overcome by any incremental change only.

Prediction of the Scenario

At run-time, a scenario has to be selected from the scenario set based on the actual parameter values. This selection process is referred to as scenario prediction. In the general case, the parameter values may not be known before the RTS starts, so they may have to be estimated. Prediction is not a trivial task; both the number of parameters and the number of scenarios may be considerable, so a simple lookup in a list of scenarios may not be feasible. The prediction incurs a certain run-time overhead, which depends on the chosen scenario set. Therefore, the scenario set may be refined based on the prediction overhead. In this step two decisions are made at design-time, namely selection of the run-time detection algorithm and scenario set refinement.

Exploitation of the Scenario Set

At design-time, the exploitation step is essentially based on some optimization that is applied when no scenario approach is applied. A scenario approach can simply be put on top of this optimization by applying the optimization to each scenario of the scenario set separately. Using the additional scenario information enables better optimization.

Switching from One Scenario to Another

Switching is the act of changing the system from one set of knob positions (see below) to another. This implies some overhead (e.g., time and energy), which may be large (e.g., when migrating a task from one processor to another). Therefore, even when a certain scenario (different from the current one) is predicted, it is not always a good idea to switch to it, because the overhead may be larger than the gain. The switching step selects at design-time an algorithm that is used at run-time to decide whether to switch or not. It also introduces into the application the way how to implement the switch, and refines the scenario set by taking into account switching overhead.

Calibration

The previous steps of the methodology make different choices (e.g., scenario set, prediction algorithm) at design-time that depend very much on the values that the RTS parameters typically have at run-time; it makes no sense to support a certain scenario if in practice it (almost) never occurs. To determine the typical values for the parameters, profiling augmented with static analysis can be used. However, the ability to predict the actual run-time environment, including the input data, is obviously limited. Therefore, also support is foreseen for infrequent calibration at run-time, which complements all the methodology steps previously described.

Hence, there is a need for an improved method for system scenario based design.

SUMMARY

It is an object of embodiments of the present disclosure to provide for a method for system-scenario based design wherein internal data variables used in the application implemented on the embedded platform are exploited.

The above objective is accomplished by the solution according to the present disclosure.

In a first aspect the disclosure relates to a method for system scenario based design for an embedded platform whereon a dynamic application is implemented, whereby said dynamic application has to meet at least one guaranteed constraint and whereby the application has temporal correlations in the behaviour of internal data variables used in the dynamic application. The internal data variables represent parameters used for executing a portion of the application. The method comprises the steps of
  determining a distribution over time of an N-dimensional cost function, with N being an integer and N>=1, corresponding to the implementation on the platform for a set of combinations of the internal data variables; and
  partitioning the N-dimensional cost space in at least two bounded regions, each bounded region containing cost combinations corresponding to combinations of values of the internal data variables of the set that have similar cost and frequency of occurrence, whereby one bounded region is provided for rarely occurring cost combinations.

The present disclosure proposes determining cost regions that are derived from data variables, from which corresponding system scenarios can be obtained. More particularly, correlations over time assumed present between the internal data variables used in the application (algorithm) are exploited. An N-dimensional cost function is determined for the implementation of the application for a set of combinations of the internal data variables. Next, the cost space is partitioned into a number of bounded regions. Each bounded region clusters combinations of internal variable values that have a similar cost and also have a certain, sufficiently large frequency of occurrence. In contrast, a separate bounded region is provided that collects rarely occurring combinations of internal data variable values. The proposed solution yields a gain in cost due to the fact that instead of the overall worst-case cost solution for the system, a worst-case cost solution per a bounded region is now available.

In a preferred embodiment, the method comprises a step of subdividing the at least two bounded regions into one or more system scenarios and clustering within a system scenario the tuples of internal data variable values that have similar cost and sufficiently large frequency of occurrence. A separate scenario is provided that corresponds to the above-mentioned separate bounded region provided for rarely occurring combinations. This is called the back-up scenario. In a preferred embodiment the method comprises a step of performing a backward reasoning on an observed set of internal data variable values for determining the bounded region the observed set belongs to. This subdivision in the variable space enables run-time detection of the scenarios.

In an advantageous embodiment, each of the system scenarios is represented by taking the combination of values of internal data variables with the highest cost impact in each system scenario. This representation, i.e. this set of internal data variable values, is then used in the implementation of the application for performing e.g. calculations on the platform. Due to the frequently occurring RTSes that are clustered in scenarios each corresponding to a bounded region with a lower than "overall worst-case" maximum cost, the average cost goes down. Different costs can for example be due to the use of an alternative mapping or scheduling of tasks in one scenario as compared to another.

In a preferred embodiment, the original guaranteed constraint imposed to the embedded system is met for each bounded region separately by the worst-case cost (i.e. the N-dimensional cost tuple in the cost space) that can occur in said bounded region. In that way it is assured that the application continues to meet this constraint, also when various scenarios for the application are defined.

In another preferred embodiment, the N-dimensional cost function takes into account at least two costs of the group {area, memory size, dynamic energy, leakage energy}. Advantageously, also the cost related to system scenario detection at run-time and/or the cost related to a switch of system scenario at run-time is taken into account.

In another embodiment, also temporal correlations in one or more input signals of the dynamic application are exploited. Said exploiting then advantageously comprises predicting in which range of a plurality of input signal value ranges future values of said input signal belong to. The predicted range is next preferably taken into account when identifying a scenario.

Advantageously, the frequency of occurrence of input signal values is taken into account. This further allows keeping the behaviour within certain limits such that the risk of not meeting the imposed constraint is reduced or even avoided.

In another preferred embodiment, said exploiting comprises predicting in which range of a plurality of input signal value ranges future values of the input signal belong to, said input signal value ranges being indicated by threshold levels.

Advantageously, a step of trimming is then performed to fine-tune the threshold level values until a desired threshold level distribution is reached.

In another embodiment, data curves of input signals waveforms are buffered and exploited in the prediction.

In yet another embodiment, the step of partitioning comprises performing a balancing function for determining the ranges of the bounded regions.

Preferably the method comprises a step of ordering the combinations of values of the internal data variables according to the cost function value they yield.

The N-dimensional cost space is advantageously partitioned in polyhedrons.

The method discloses in one embodiment wherein a top-down partitioning for arbitrary large domain is applied.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

DESCRIPTION OF THE DRAWINGS

The disclosure will now be described further, by way of example, with reference to the accompanying drawings, wherein like reference numerals refer to like elements in the various figures.

DETAILED DESCRIPTION

Figure 1:
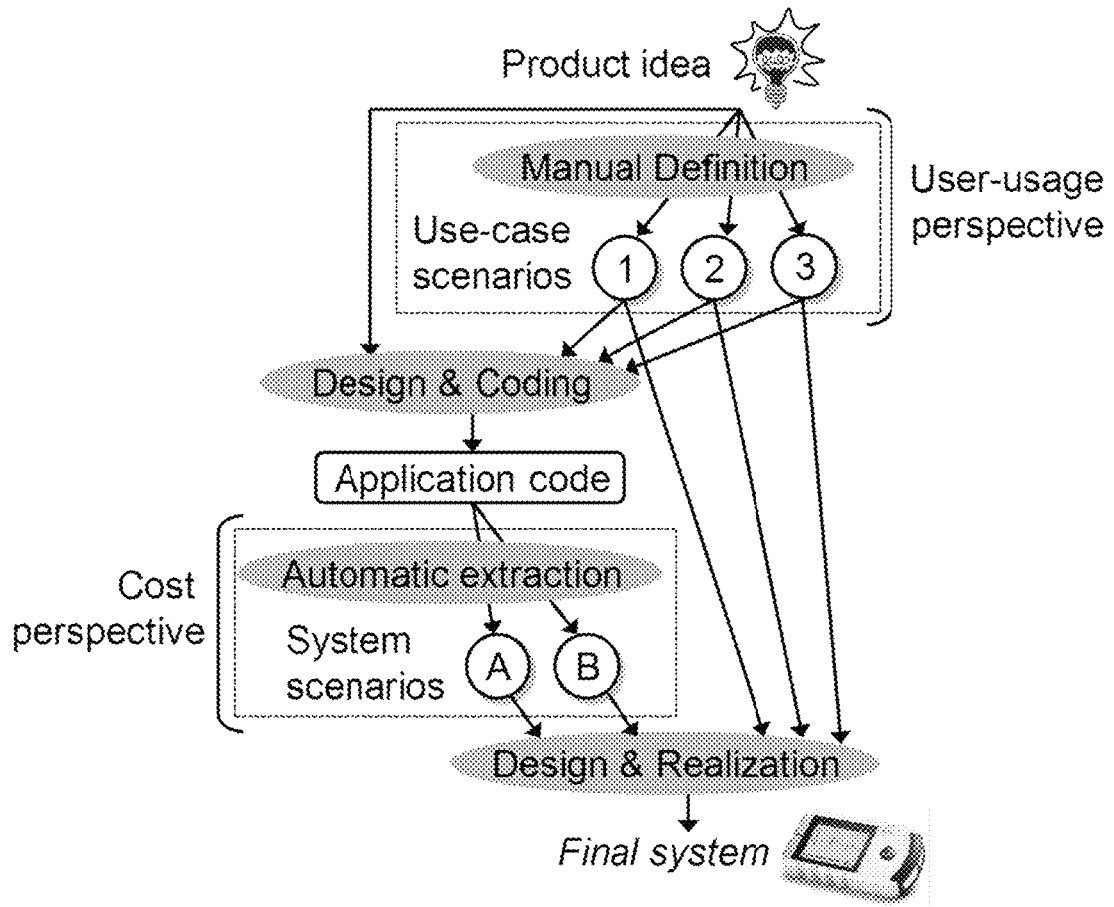
FIG. 1 illustrates a scenario-based design flow for embedded systems.

The present disclosure will be described with respect to particular embodiments and with reference to certain drawings but the disclosure is not limited thereto but only by the claims. Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments. Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The goal of a scenario based method is, given an embedded system, to exploit at design-time the possible RTSs, without getting into an explosion of detail. If the environment, the inputs, and the hardware architecture status would always be the same, then it would be possible to optimally tune the system to that particular situation. However, since a lot of parameters are changing all the time, the system must be designed for the worst case situation. Still, it is possible to tune the system at run-time based on the actual RTS. If this has to happen entirely at run-time, the overhead is most likely too large. So, an optimal configuration of the system is selected up front, at design-time. However, if a different configuration would be stored for every possible RTS, a huge database is required. Therefore, the RTSs similar from the resource usage perspective are clustered together into a single scenario, for which a tuned configuration is stored for the worst case of all RTSs included in it.

An important issue when designing a scenario-based methodology concerns the introduction of various overheads due to switching between scenarios, storing code for a set of scenarios instead of a single application instance, predicting the RTS, etc. The decision of what constitutes a scenario has to take into account all these overheads, which leads to a complicated problem. Therefore, the system scenario approach is divided into steps. Further, using a scenario method, the system requires extra functionality: deciding which scenario to switch to (or not to switch), using the scenario to change the system configuration, and updating the scenario set with new information gathered at run-time.

Many system parameters exist that can be tuned at run-time while the system operates, in order to optimize the application behaviour on the platform which it is mapped on. These parameters are called system knobs. A huge variety of system knobs is available. Anything that can be changed about the system during operation and that affects system cost (directly or indirectly) can be considered a system knob. The changes do not have to occur at the hardware level; they can occur at the software level as well. A particular position or tuning of a system knob is called a knob position. If the knob positions are fully fixed at design-time, then the system always has the same fixed, worst case cost. By configuring knobs while the system is operating, the system cost can be affected. However, tuning knob positions at run-time introduces overhead, which should be taken into account when the system cost is computed.

Instead of choosing a single knob position at design-time, it is possible, and highly desirable, to design for several knob positions. At different occurrences during run-time, one of these knob positions is chosen, depending on the actual RTS. When the RTS starts, the appropriate knob position should be set. Moreover, the knob position is not changed during the RTS execution. Therefore, it is necessary to determine which RTS is about to start. This prediction is based on RTS parameters, which have to be observable and which are assumed to remain sufficiently constant during the RTS execution. These parameters together with their values in a given RTS form the RTS snapshot. Taking the example of a H.264 decoder, the RTS corresponds to the decoding of a frame, and the RTS parameter is the frame breakup into the macroblock types.

The number of distinguishable RTSs from a system is exponential in the number of observable parameters. Therefore, to avoid the complexity of handling all of them at run-time, several RTSs are clustered into a single system scenario. A trade-off is present between optimisation quality and run-time overhead of the scenario exploitation. At run-time, the RTS parameters are used to detect the current scenario rather than the current RTS. In principle, the same knob position is used for all the RTSs in a scenario, so they all have the same cost value: the worst case of all the RTSs in the scenario. Therefore, as motivated also above, it is best to cluster RTSs which have nearby cost values. Since at run-time any RTS may be encountered, it is necessary to design not one scenario but rather a scenario set. A scenario set is a partitioning of all possible RTSs, i.e., each RTS must belong to exactly one scenario.

MOTIVATIONAL EXAMPLE

Recent biomedical applications for outpatient care have a dynamic nature and are at the same time subject to strict cost constraints. They continuously monitor a patient's signals for an anomaly and perform specific tasks when the anomaly is detected. They may use complex signal processing on multiple channels and are required to be powered by a battery for months or even years. One such example is an epileptic seizure predictor, which tracks electroencephalography (EEG) signals from up to 32 channels and may warn patients of upcoming seizures hours in advance. A part of this predictor performs calculations for each channel once every 10 seconds. Due to different EEG input data, the energy consumption of one calculation can vary widely from 6 mJ to 13 mJ. The peak energy consumption for this application occurs only once in the 6 hours long EEG recording. A system designed based on this worst case energy consumption will consume 829 J/channel while processing the recording.

An ideal workload-adaptive system is able to configure the system optimally in each run so that it consumes the minimum amount of energy possible. A heavily optimized thread-level workload-adaptive design can never be built in practice as the costs of reconfiguring such system, storing the different configurations and predicting them would be excessive.

A system scenario-based design methodology uses the same concept of adaptively reconfiguring the system, but allows only a limited set of possible configurations. A given system scenario has a fixed system cost corresponding to its system configuration. It contains the group of runs for which this configuration is better than any of the other configurations in the limited number of scenarios. For most runs the system will then require a small energy overhead compared with running on the optimal configuration, but far less than the system based on the worst case energy consumption. There will be an added energy consumption related to the scenario detection and reconfiguration, but this can be kept low if the guidelines for scenario based design are followed.

Internal behaviour of algorithms is governed by strong correlations in the time evolution of the internal data variables due to the dependencies between the internal data and the control flow which are described in the CDFG (Control Data Flow Graph). For instance, when data variables are positive and they are accumulated in a recursive loop, one knows the output data variable of this accumulation will monotonically grow. The same potentially correlated behaviour also applies for the waveforms for input data in typical signal processing applications. For instance, the input for a wireless LAN communication receiver is directly corresponding to the choices of the modem technique which has been selected in the corresponding transmitter and the channel condition of the intermediate wireless channel. That correlated behaviour can be exploited for improving the average system cost of a dynamic system far beyond the worst-case cost, while still meeting all system constraints. For this purpose the following system scenario concept is proposed which exploits the internal data variable correlations and input data correlations.

Internal data variables in the algorithm have partly predictable future evolution in time, which can be derived from these correlations. These internal data variables also include the current set of internal state variables. For instance in a FIR filter of order n, the n variables in the n-tap delay line represent the state variables from which all other variables can be derived at a given time instance. These time evolutions are labelled as sequences of RTSs. This input data and internal state variable behaviour is in general very non-uniform though and it can only be represented by a heavily non-linear function $F_{system}$ of the input data and the "previous" or "old" internal state variables. Hence, one can write for the internal data variable:

internal_data_var=$F_{system}$(old_state_var, input_data)

Hence, any implementation/realisation of this behaviour on some given platform also has such a correlation-based partial predictability, involving another non-linear function $F_{platf}$ mapping with the internal data variable behaviour as input this time. One can write:

platform_node_behav=$F_{platf}$(internal_data_var)

For instance, the values stored in the registers of the processor data path are important parts of the platform node behaviour. Finally, also the N-dimensional cost associated with this implementation has a non-uniform distribution over time with some cost combinations in the N-dimensional space occurring more often than others. In particular, one can write:

{cost}=$F_{cost}$(platform_node_behav)

where {cost} is an N-dimensional set. For instance, important costs include area, memory size, dynamic energy, leakage energy and so on. Which cost combinations (or regions of cost combinations) occur more frequently can also be analysed from this non-linear function behaviour.

Figure 2:
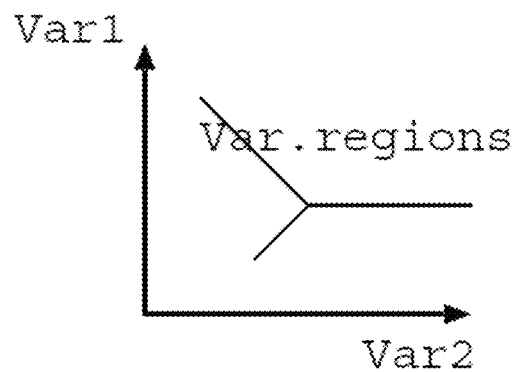
FIG. 2 illustrates a two-dimensional cost space divided in regions.

Hence, when these cost combinations in $F_{cost}$ are profiled for a representative set of input data and internal state variables one can obtain a good coverage of these highly frequently occurring regions in the N-dimensional cost space and each of these can be clustered into distinct system scenarios, in general a set {sys_scen}. This is also illustrated in FIG. 2 where three geometrically partitioned regions are identified in a 2-dimensional cost domain. For instance the lower values of a while loop interval could be sys_scen1, the middle range sys_scen2 and the higher range sys_scen3. Depending on the maximal amount of loop iterations that is required the choice of mapping such a loop on the platform will differ. Within the embedded system context such a maximum loop iteration count is always known at design-time.

With the scenario boundary decisions, both sys_scen1 and sys_scen2 have an upper bound on the number of iterations which is now significantly better (lower) than the worst-case bound of the original application code. The remaining more rarely occurring cost combinations in the overall application profiling are then grouped together into a single so-called back-up system scenario which on average will be active very seldom. However, this back-up scenario also has to take the worst-case cost combination into account as it has to serve a highly non-uniform set of RTSs that cannot be restricted to better than worst-case behaviour given that we want to meet a guaranteed constraint. Each of these system scenarios can now be represented as a bounded region and, in most practical cases, it is observed that an approximation of this boundary by polyhedral regions or sets of polyhedrons provides a very useful formal representation.

The worst-case behaviour per system scenario in terms of cost axes can now typically be significantly restricted compared to the overall worst-case behaviour of the entire system, because of these polyhedral bounds that span only part of the potential cost behaviour. The only exception is the rarely occurring back-up scenario which still has to be represented by the worst-case behaviour. This reduced behaviour of the regular system scenario set {sys_scen} can then also be mapped more efficiently by separately tuning the mappings to the characteristics of each specific system scenario.

Assuming the system scenario, which is active at run-time, can be detected in a safe way (see below), these bounds now still provide strict guarantees of the system constraints, but at a reduced average cost. Even for the cases where a heavily reduced bound (compared to the worst-case) cannot be given, one can predict which system scenario is active and within that scenario usually also predict with a significant probability of success which actual RTS is active. Even if one partly fails in the correctness of that prediction, one will be more often correct and the average cost over a longer execution duration will be reduced.

The clustering into system scenarios determines that gain to a large extent. In principle, at design-time and based on profiling one can then find the system scenario clustering which maximizes this average cost gain but a trade-off is present then with the detection cost for the active system scenario and also with the switching overhead of having to move to the "best" scenario whenever the input and state have sufficiently evolved. These three cost contributions should hence drive the best system scenario identification method (see below).

The active system scenario detection still needs to be described. For that purpose a backward reasoning can be performed from the bounded cost regions corresponding to the selected system scenarios back to the input and state variable space of the algorithm. This is again governed by a heavily non-linear function. In particular:

{internal_state_var_regions}=$F_{sys\_scen\_regions}$(internal_state_var).

Per system scenario a bounded variable region is then obtained, which preferably is again approximated based on (sets of) polyhedra. See FIG. 2 for an illustration of how a 2-dimensional internal data variable domain is partitioned into three regions corresponding to three system scenarios. For instance, the iteration range of a while loop or the size of an array from which data are read can be such data variables on which we want to determine (detect) the active system scenario. Whenever one now has an input data and internal state variable condition falling within these polyhedra at run-time, one knows that it will give rise to the corresponding system scenario. That is indeed true also for the input data when one has a proper prediction procedure available.

One problem tackled in the present disclosure concerns, as already mentioned, the drawback of the prior art solutions that in the process of scenario set identification only control variables or variables with a limited number of distinct values have been considered as parameters to decide on the scenario boundaries. When the parameters are data-dependent, they may have thousands or even millions of possible data values making bottom-up clustering and enumeration-based prediction as encountered in the prior art solutions impractical. The present disclosure therefore proposes a scenario identification technique for use in a system scenario based design methodology, said technique being suitable for systems having parameters with widely varying data-dependent values.

Figure 3:
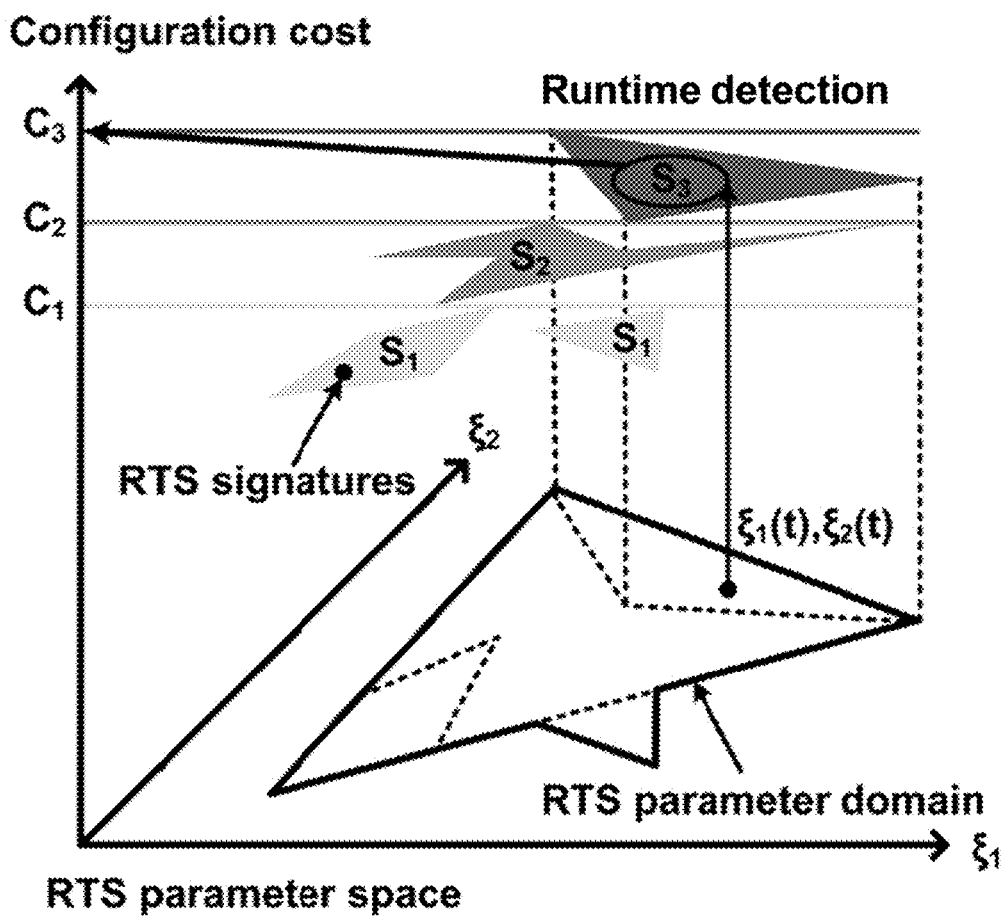
FIG. 3 illustrates the concept of system scenario identification.

FIG. 3 illustrates the theoretical concepts of the proposed scenario identification technique, given k RTS parameters and N profiled RTS signatures as in Equation 1. If one dimension is assigned to each RTS parameter, the resulting k-dimensional space defines all theoretically possible values for the RTS parameters in the application. Such space is called an RTS parameter space. When static max and min constraints on the values are added, the space reduces to one or several k-dimensional domains.

Assuming a (k+1)th dimensional cost representation for each RTS, all signatures can then be plotted as points in a k+1 dimensional space. In the profiling sequence, several identical signatures may exist, giving coinciding points in the space. The number of times a point repeats itself is useful information as it quantifies the probabilities of occurrence of each RTS.

With the representation above, the scenario identification task can be viewed as a distribution of points into S different groups, representing system scenarios, according to which the overall configuration cost is minimized. An RTS point i is assigned to scenario j whenever its cost c(i) falls into that scenario's cost range $\{C(j)_{min}, C(j)_{max}\}$. The scenario cost ranges are determined by a balancing function that ensures that all scenarios have a near-equal probability to occur at run-time. In this way, rare system scenarios are avoided since their storage cost will exceed the gains of adding them. This probability is measured by the number of points, including the repeating ones, that each scenario contains and call it scenario size. Given a list r of sorted by descending cost RTS signatures, the scenario cost ranges are then given by the indices corresponding to the integral number of maximum scenario sizes N/S:

$$C(j)_{max} = r((j-1) \cdot N/S + 1) \quad (2)$$

$$C(j)_{min} = r((j) \cdot N/S) \quad (3)$$

The cost of scenario $C_j$ is defined as the maximum cost of RTS signatures that it includes: $C_j = C(j)_{max}$.

The projection of scenarios onto the RTS parameter space (see FIG. 3) will produce M≥S regions that characterize the system scenarios in terms of RTS parameter values. Each region can be described as a polyhedron, and the run-time scenario prediction can be done by checking which polyhedron contains the RTS parameter values of the next RTS. Since it is known which scenario the region belongs to, one can foresee that the next running cost will be no more than the cost of that scenario. Checking if a point lies inside a polyhedron is the classical data point location problem from the computational geometry domain, and the advantage of using it for prediction instead of MDD is that it operates on/stores only the vertices of polyhedral regions, not the whole RTS parameter space.

This top-down partitioning approach based on geometrical techniques can handle arbitrary large domains, provided that the number of distinct geometric regions stays reasonably low. Otherwise prediction overhead will grow. The number of regions depends on the number of system scenarios and the underlying structure of the system—the relationship between the cost locality of RTS points and the value locality of their RTS parameters.

The desired number of system scenarios is best defined by the user according to the characteristics of the application domain. Typically this is limited to a few tens because beyond that the potential gains in better following the system dynamics are counterbalanced with the additional cost complexity of detecting and exploiting the (too) large set of possible system scenarios.

For the biomedical application that was mentioned earlier as an example, a strong correlation is present in the locality of the RTS parameter values and the locality of the corresponding costs on the target DSP platform, resulting in a single region per scenario.

Now some more details are provided on a possible implementation of the scenario identification algorithm. First a pre-processing step may be performed, where profiled RTS signatures are sorted by their costs starting from the worst case. A worst case system scenario is created. The system scenario is filled in with signatures having the next costs in the sorted sequence. When the size of the system scenario exceeds the maximum possible size, a new system scenario is created. Each completed system scenario is checked for overlap with previously calculated higher cost system scenarios. An overlap means that the scenario regions in the RTS parameter space are not disjoint, and equals the intersection of the regions. The intersections make prediction of scenarios ambiguous and have to be eliminated. This is done by moving all signatures in the overlap region to the higher cost system scenario, or, correspondingly, subtracting the overlap region from the lower cost scenario. Given C1>C2, this operation can be written as: scenario2.paramRegion←scenario2.paramRegion−overlap.

The complexity of the algorithm depends on the number of RTS signatures, the number of scenarios and the complexity of the underlying geometric algorithms in the labelled functions.

To add a signature an operation is performed on the existing border of the scenario and the projection point of the new RTS signature onto the RTS parameter space. For a two-dimensional RTS parameter space this can be done by an incremental convex hull algorithm having complexity O(v log v) for v vertices in the convex hull. The convex hull algorithms create an expected number of v=O(log N) vertices and many of them may lie very close to each other. To limit the number of vertices in the hull for faster run-time prediction, the algorithm is modified, such that it calculates the distance between the points on the hull and removes those that are closer than $L/v_{max}$, where L is the perimeter of the hull, and $v_{max}$, is a user defined constraint of the maximum number of vertices in the prediction polyhedra.

For determining overlap and region border adjustment Boolean set operations are applied for intersection and difference of two d-polytopes. For the case d=2 these operations can be done in $O(v^2)$ time, giving a total complexity of the algorithm of $N+\frac{1}{2}S(S-1)O(v^2)+S$, with N the number of RTS signatures and S the number of system scenarios.

For d>2 the complexity of convex hull and boolean set operations on polytopes may increase exponentially in d, but since v<<N and typically bounded by an upper limit, and the number d of selected RTS parameters is small, the complexity of this algorithm will still be very reasonable. Its largest component is linear in the number of RTS signatures N, which is the only parameter that can grow to become very large in practice.

In the approach sketched above convex scenario projections are produced in the RTS parameter space. However, in some situations, concave scenario projections are preferable: a) the inherent correlation between the RTS parameter values and the corresponding costs has a concave shape; and b) the system scenarios overlap in the RTS parameter space and complete migration of the signatures to the higher cost system scenarios results in considerable reduction of run-time gain. The overlaps may be produced by variables affecting the costs but not selected as RTS parameters. They can also be caused by non-deterministic properties of the underlying platform resulting in different costs for the same RTS parameters.

A concave scenario projection generally reduces the overlap and improves the run-time gain. However, large overhead may incur since algorithms processing concave polyhedra are much more complex. A possible solution is to split the concave projection into a set of convex polyhedron at design-time and apply convex hull algorithms. The separate polyhedra still require additional storage and processing time, which should be kept low. To achieve that, a restriction must be made on the number of reflex angles in the concave projection, and also a careful consideration of the cost trade-offs must be made.

To make the use of system scenarios based on data correlations feasible one obviously has to make sure that scenarios based on data variables are detectable. Future values of the data variables can be predicted based on a variable sized buffer of the previous values. As the prediction of the exact signal is not feasible and not required anyway, the prediction involved here has to do with the prediction of the range the next value will end up to be in. Then the range can be used for scenario definition. A main approach of the prediction process is detailed below. However, it is to be noted that this just illustrates one possible way to define a tresholding function that distinguishes for each scenario a bounded region (in the space defined by tuples of internal data variable values—see above) where the scenario is detected versus a region where it is not detected (i.e. the scenario is not active). Many alternatives are available, as the skilled person will readily appreciate.

Figure 4:
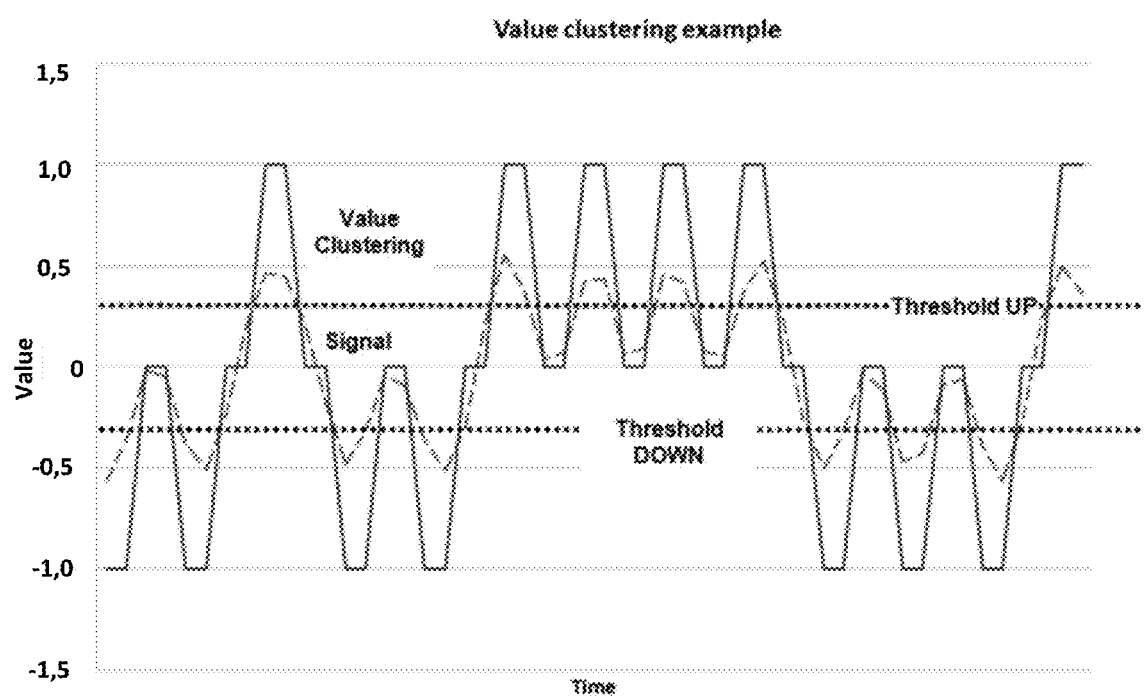
FIG. 4 represents an example of clustering of signal values in three levels.

The dynamic range of the signal is split into three different ranges separated by two thresholds. In FIG. 4 the signal waveform at the digital filter input is shown (dashed line). The value clustering curve (solid line) shows the result of levelling the signal values after using the two thresholds UP and DOWN as shown in the same figure. The general rule to use these thresholds is shown in the value clustering function below:

$$\text{clustered\_value(value)} = \begin{cases} 1 & \text{value} > \text{THRESHOLD} \\ -1 & \text{value} < -\text{THRESHOLD} \\ 0 & \text{otherwise} \end{cases}$$

First absolute data is used to define the positive threshold. The negative threshold is just the negative value of the positive. In order to find the preferable threshold, first a threshold is selected that evenly divides the dynamic range. Then the threshold is trimmed to end up with a distribution of the signal values across the three sub-ranges as uniform as possible. However, the creation of one or more large sub-ranges, the sizes of which might be comparable with the dynamic range should be avoided. That is because the usefulness of the prediction is compromised.

Figure 5:
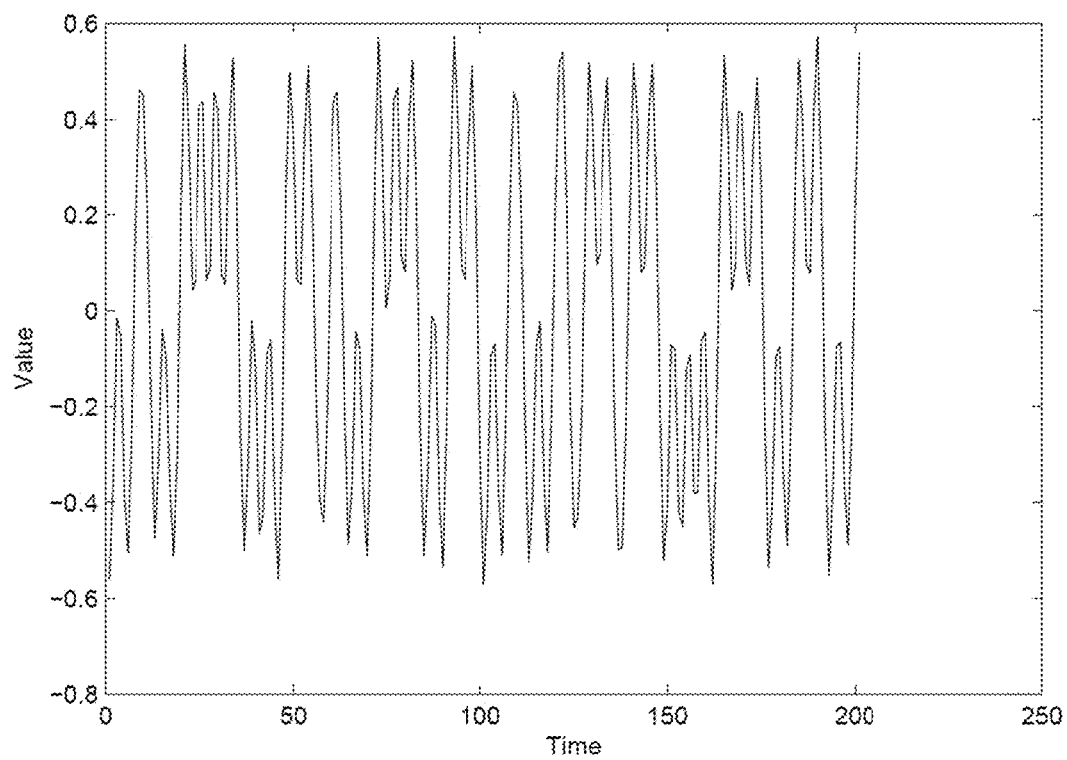
FIG. 5 illustrates the original input of a digital filter.
Figure 6:
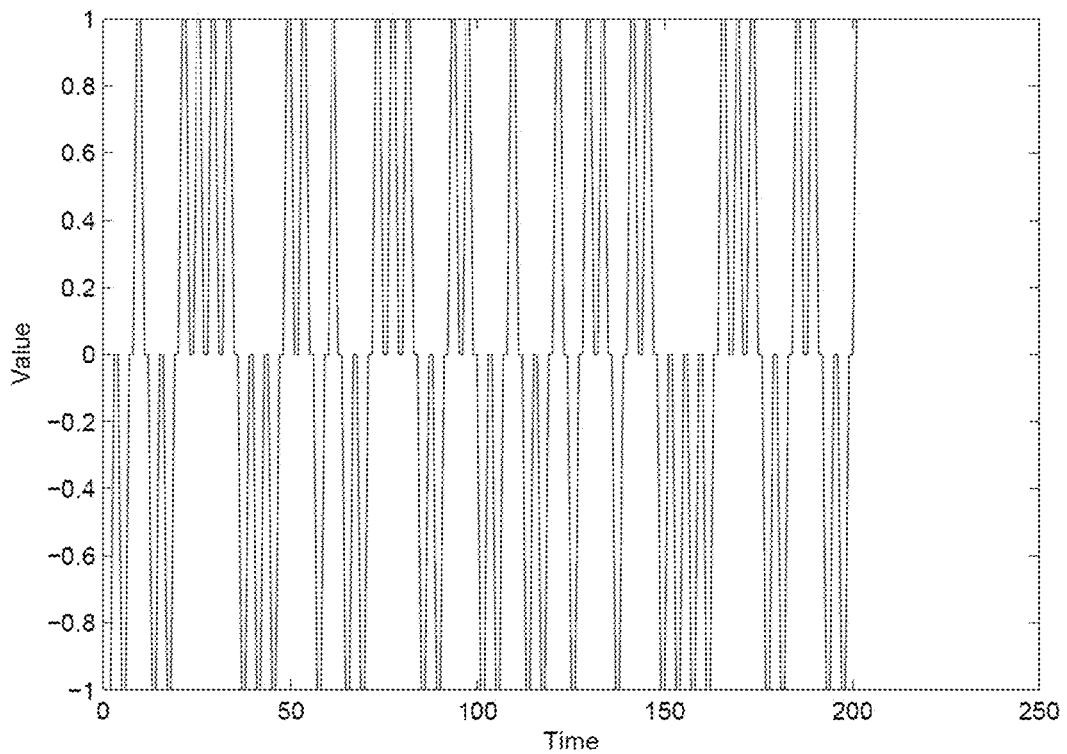
FIG. 6 illustrates clustered input of the digital filter.

The main approach of the prediction process is detailed below for the example of a digital filter and Fast Fourier Transform (FFT) of which the inputs need to be estimated. These are the dominant blocks inside the digital baseband specification of the 60 GHz receiver standard. The threshold used for the digital filter is 0.3 and for the FFT 0.8. This selection is based on the dynamic range and the data histogram. A lot of samples of the digital filter input are obtained. When the original digital filter input waveform is used, the pattern one tries to exploit is not easily distinguishable. However, it becomes visible only after clustering the signal values to the three ranges mentioned above. In FIGS. 5 and 6 the original waveform is shown before and after the clustering. In FIG. 6 the pattern is indeed more obvious.

Given the thresholds of −0.3 and 0.3 and considering the dynamic signal range is [−0.52 0.52] the occurring ranges are [−0.52 −0.3), [−0.3 0.3], (0.3 0.52]. For each sample it is evaluated whether it is in the first range (thus gets the value −1), in the middle range (value 0) or in the third range (value 1). Using this transformation FIG. 6 has been generated. Different buffer sizes (to store values of previous samples) are used as well as different numbers of samples that are predicted.

Figure 7:
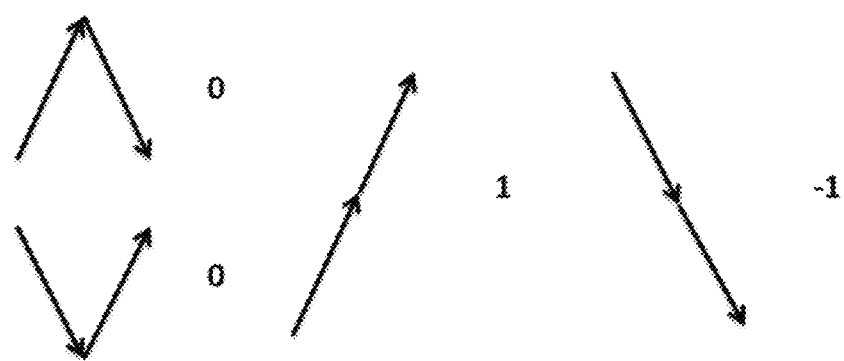
FIG. 7 illustrates prediction curves coding.

Some possible predictor algorithms are now described by way of example. One option is to predict the next value based solely on the previous and current signal values. A noteworthy property of the waveform is that there are always two samples residing in the same range. So, if the previous sample belongs to a different range than the current one the next sample will be in the same range as the current one. Hence, if the current value is different from the previous one then it should be repeated and the next value is the same as the current and if it is different, the next value is predicted as the opposite of the current. Data may be used as it is or may be flipped (whereby only the absolute signal value is used and only the positive threshold) before being processed. Another option for the prediction algorithm is one whereby an additional buffer is used that stores curves so that the predictability can be increased. Using a small buffer, one tries to describe a single waveform curve and based on the stored curve the next waveform values can be predicted. For example, a single curve can be described by four samples which are stored in a buffer. As far as the curves are concerned they are coded based on the ranges of four consecutive samples. In FIG. 7, the used coding is shown. In the figure each curve is described by three points. Due to the previously described property of the value repetition, the middle point is repeated and the repetition is omitted in the figure. To identify a curve the samples at the edges of each curve are needed (three in total). The predictions based on the curve are based only on the previous curve. It is safe to assume that when using a larger curve buffer, the exploitation of the pattern appearing at a larger scale is feasible. On the other hand, the complexity of the algorithm will increase slightly.

It can readily be assumed that input values fluctuate. There is an alternating change in the signal value towards different direction each time. One then tries to estimate the width of the next signal fluctuation. One possibility is to start with limited prediction on only the next fluctuation. Based on the previous fluctuation a first possible algorithm can be as simple as this: the next fluctuation is considered to be the previous with the different direction (if the previous was positive then the next one will be negative and vice versa). To further reduce the error in the predicted values, an alternative can be to subtract the error of the previous calculation from the prediction of the next value. Other alternative may use the average value of a buffer holding either the last values or the last few fluctuations of the signal. A further option is an algorithm that takes into account a Taylor series property. Three samples in a row are forming a function $f(x)$ (a different function each time). Considering the first sample value as $f(0)$, we can calculate $f'(x)$ using the differences between the $f(0)$, $f(1)$, $f(2)$. This can be done easily by using a 2 samples buffer for the $f(0)$ and $f(1)$ and have the $f(2)$ as the current value. The $f(0)$ and the $f(1)$ can be stored in another buffer too. The differences of the derivative values form the second derivative which can be used to have a better approximation of the Taylor series.

This is now illustrated for the FFT example. Also for the FFT various approaches for prediction can be envisaged for the FFT input data. In the examples below the fluctuation of the FFT input values is taken into account. Prediction on only the next fluctuation and the use of (trimmed) thresholds as set out above only yields moderate results. When subtracting the error of the previous calculation from the prediction of the next value, improved performance can be observed. This confirms that data prediction is indeed feasible for the FFT as well. Other alternative may use the average value of a buffer holding either the last values or the last few fluctuations of the signal. Further performance improvement can be obtained by applying the above-mentioned Taylor series approach, especially when also the second derivative is taken into account.

While the disclosure has been illustrated and described in detail in the drawings and foregoing description, such illustration and description are to be considered illustrative or exemplary and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable non-transitory medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A method for system scenario-based design for an embedded platform whereon a dynamic application is implemented, comprising:

for an implementation of the dynamic application on the embedded platform, determining, over a non-zero time period by a computing device having a processor and a non-transitory memory, a plurality of combinations of values of internal data variables, wherein the internal data variables represent parameters used to implement at least a portion of the dynamic application, and wherein the dynamic application meets at least one guaranteed constraint and has temporal correlations in a behavior of the internal data variables;

based on the plurality of combinations, determining, by the computing device, a distribution of an N-dimensional cost function over the non-zero time period, wherein N is an integer greater than or equal to one; and based on the distribution, partitioning, by the computing device, an N-dimensional cost space into at least two bounded regions of combinations such that, for each of the at least two bounded regions, the values of the internal data variables in each combination have similar costs and similar frequencies of occurrence.

2. The method for system scenario-based design of claim 1, further comprising:

subdividing, by the computing device, each of the at least two bounded regions into one or more system scenarios; and for each of the one or more system scenarios, clustering, by the computing device, the combinations such that values of the internal data variables included in each clustered combination have similar costs and similar frequencies of occurrence values.

3. The method for system scenario-based design of claim 2, wherein each of the one or more system scenarios is represented by the combination included in the system scenario corresponding to a highest cost.

4. The method for system scenario-based design of claim 1, wherein the at least one guaranteed constraint is met for each of the at least two bounded regions separately by a worst-case cost that can occur in the bounded region.

5. The method for system scenario-based design of claim 1, wherein the N-dimensional cost function takes into account costs associated with at least two of an area, a memory size, a dynamic energy, or a leakage energy.

6. The method for system scenario-based design of claim 1, wherein the N-dimensional cost function takes into account at least one of (i) a cost related to a system scenario detection at run-time or (ii) a cost related to a switch of system scenario at run-time.

7. The method for system scenario-based design of claim 1, wherein determining the distribution further comprises exploiting temporal correlations in input signals of the dynamic application.

8. The method for system scenario-based design of claim 7, wherein the temporal correlations in the input signals are based on frequencies of occurrence of values of the input signals.

9. The method for system scenario-based design of claim 7, wherein exploiting the temporal correlations comprises predicting from a plurality of ranges a range of a future value of an input signal, wherein each range in the plurality of ranges is bounded by threshold levels.

10. The method for system scenario-based design of claim 9, wherein trimming is performed to determine the threshold levels for each range in the plurality of ranges until a desired distribution of the threshold levels is reached.

11. The method for system scenario-based design of claim 9, wherein data curves of input signal waveforms are buffered and exploited when predicting the range of the future value of the input signal.

12. The method for system scenario-based design of claim 1, wherein partitioning the N-dimensional cost space comprises performing a balancing function for determining ranges of the at least two bounded regions.

13. The method for system scenario-based design of claim 1, further comprising ordering the combinations according to corresponding values of the N-dimensional cost function.

14. The method for system scenario-based design of claim 1, wherein the N-dimensional cost space is partitioned into polyhedrons.

15. The method for system scenario-based design of claim 1, wherein partitioning the N-dimensional cost space comprises applying a top-down partitioning.

16. The method for system scenario-based design of claim 1, wherein each of one or more rarely occurring cost combinations is grouped into a single bounded region that is included in the at least two bounded regions.

17. The method for system scenario-based design of claim 1, wherein the value of at least one of the internal data variables is dynamic and data-dependent.

* * * * *